(12) United States Patent
Chudzik et al.

(10) Patent No.: US 9,373,690 B2
(45) Date of Patent: Jun. 21, 2016

(54) VARIABLE LENGTH MULTI-CHANNEL REPLACEMENT METAL GATE INCLUDING SILICON HARD MASK

(71) Applicant: GLOBALFOUNDRIES INC., Grand Cayman (KY)

(72) Inventors: Michael P. Chudzik, Danbury, CT (US); Siddarth A. Krishnan, Peekskill, NY (US); Unoh Kwon, Fishkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/826,466

(22) Filed: Aug. 14, 2015

(65) Prior Publication Data

US 2015/0349076 A1 Dec. 3, 2015

Related U.S. Application Data

(62) Division of application No. 14/088,462, filed on Nov. 25, 2013.

(51) Int. Cl.
| | | |
|---|---|---|
| *H01L 29/78* | (2006.01) | |
| *H01L 27/088* | (2006.01) | |
| *H01L 29/423* | (2006.01) | |
| *H01L 27/092* | (2006.01) | |
| *H01L 21/8238* | (2006.01) | |
| *H01L 29/49* | (2006.01) | |
| *H01L 21/3213* | (2006.01) | |
| *H01L 21/28* | (2006.01) | |

(Continued)

(52) U.S. Cl.
CPC .... *H01L 29/42376* (2013.01); *H01L 21/28088* (2013.01); *H01L 21/32139* (2013.01); *H01L 21/82385* (2013.01); *H01L 21/823807* (2013.01); *H01L 27/0922* (2013.01); *H01L 29/4966* (2013.01); *H01L 29/517* (2013.01); *H01L 29/66545* (2013.01); *H01L 21/3212* (2013.01)

(58) Field of Classification Search
CPC .............. H01L 29/4236; H01L 29/42376; H01L 29/42372; H01L 27/088; H01L 27/0883; H01L 27/092; H01L 27/0922
See application file for complete search history.

(56) References Cited

U.S. PATENT DOCUMENTS

| | | |
|---|---|---|
| 5,976,767 A | 11/1999 | Li |
| 7,271,045 B2 | 9/2007 | Prince et al. |

(Continued)

OTHER PUBLICATIONS

U.S. Appl. No. 14/088,462, Office Action Communication dated Feb. 3, 2016, 8 pages.

(Continued)

*Primary Examiner* — Matthew W Such
*Assistant Examiner* — Scott Stowe

(57) ABSTRACT

A method of forming a semiconductor device includes forming first and second semiconductor structures on a semiconductor substrate. The first semiconductor structure includes a first gate channel region having a first gate length, and the second semiconductor structure including a second gate channel region having a second gate length that is greater than the first gate length. The method further includes depositing a work function metal layer in each of a first gate void formed at the first gate channel region and a second gate void formed at the second gate channel region. The method further includes depositing a semiconductor masking layer on the work function metal layer, and simultaneously etching the silicon masking layer located at the first and second gate channel regions to re-expose the first and second gate voids. A low-resistive metal is deposited in the first and second gate voids to form low-resistive metal gate stacks.

10 Claims, 10 Drawing Sheets

(51) Int. Cl.
*H01L 29/51* (2006.01)
*H01L 29/66* (2006.01)
*H01L 21/321* (2006.01)

(56) References Cited

U.S. PATENT DOCUMENTS 7,569,443 B2 8/2009 Kavalieros et al.
7,923,321 B2 4/2011 Lai et al.
8,039,381 B2 10/2011 Yeh et al.
8,093,116 B2 1/2012 Chung et al.
8,202,776 B2 6/2012 Chang et al.
2011/0201164 A1 8/2011 Chung et al.
2013/0087832 A1 4/2013 Yu et al.
2013/0187236 A1 7/2013 Xie et al.

OTHER PUBLICATIONS

U.S. Appl. No. 14/088,462, Notice of Allowance Communication dated Apr. 22, 2016, 9 pages.

US 9,373,690 B2

VARIABLE LENGTH MULTI-CHANNEL REPLACEMENT METAL GATE INCLUDING SILICON HARD MASK

DOMESTIC PRIORITY

This application is a divisional of U.S. patent application Ser. No. 14/088,462, filed Nov. 25, 2013, the disclosure of which is incorporated by reference herein in its entirety.

BACKGROUND

The present invention relates to semiconductor device fabrication, and more particularly, to a variable length, multi-channel semiconductor including low-resistive metal gate stacks.

Recent trends have turned to low-resistive metals as a desired material to form semiconductor device gate stacks. The electrical resistivity of tungsten (W) gate stacks, for example, has shown to be as much as 100 times lower than comparably sized doped polysilicon gate stacks. In addition, the larger work function of tungsten and other low-resistive metals produces low and nearly symmetrical threshold voltages for both PMOS and NMOS devices on moderately doped substrates. Accordingly, tungsten and other low-resistive metals are attractive as a gate stack material in CMOS circuit design. Tungsten, for example, has also exhibited the potential to reduced subthreshold leakage currents and decreased sensitivity to body bias as compared to conventional doped polysilicon gate stacks.

Various semiconductor structures have varying multichannel gate channels. For example, CMOS semiconductor devices may include both a narrow gate channel region and a long gate channel region. The long gate channel region, however, may be susceptible to etch loading effects when simultaneously etching the narrow gate channel region. This may cause the long gate channel region to be etched more quickly when simultaneously etching the narrow gate channel region, thereby forming non-uniform gate stacks. Therefore, an additional masking layer is typically required during the fabrication process to protect the long gate channel region from etch loading effects.

SUMMARY

According to at least one embodiment a method of forming a semiconductor device includes forming first and second semiconductor structures on a semiconductor substrate. The first semiconductor structure includes a first gate channel region having a first gate length, and the second semiconductor structure includes a second gate channel region having a second gate length that is greater than the first gate length. The method further includes depositing a work function metal layer in each of a first gate void formed at the first gate channel region and a second gate void formed at the second gate channel region. The method further includes depositing a semiconductor masking layer on the work function metal layer located at each of the first and second gate channel regions. The method further includes simultaneously etching the silicon masking layer located at the first and second gate channel regions to re-expose the first and second gate voids. The method further includes depositing a low-resistive metal in the first and second gate voids to form low-resistive metal gate stacks at the first and second gate channel regions.

According to another exemplary embodiment, a multigate semiconductor device comprises first and second semiconductor structures formed on a semiconductor substrate. The first semiconductor structure includes a first gate channel region having a first gate length, and the second semiconductor structure includes a second gate channel region having a second gate length that is greater than the first gate length. Spacers are formed on sides of the gate channel regions. A first work function metal layer is formed in the first gate channel region and a second work function metal layer is formed in the second gate channel region. The second work function metal layer includes sidewall portions formed against respective sidewalls of the spacers. The sidewall portions are separated from one another by a base portion. The multigate semiconductor device further includes a first low-resistive metal gate stack formed on the work function metal layer located at the first gate channel region, and a second low-resistive metal gate stack formed on the work function metal layer located at the second gate channel region. According to one exemplary embodiment, the second low-resistive metal gate stack is formed on upper portions of the sidewall portions. The formation of the metal gate stack, however, is not limited thereto.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

DETAILED DESCRIPTION

Figure 1:
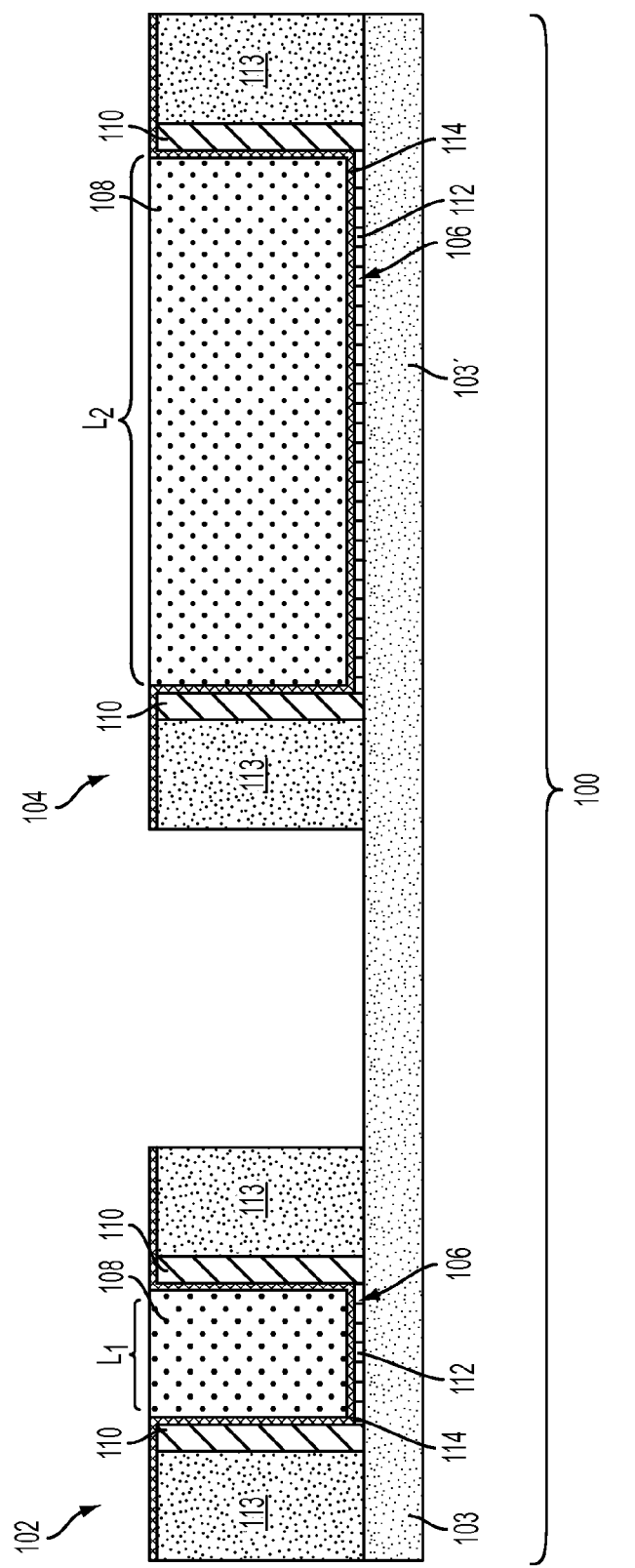
FIG. 1 is a cross-sectional view of a substrate including first and second semiconductor structures having dummy gate stacks with varying gate lengths formed thereon.

With reference now to FIG. 1, a substrate 100 is illustrated including a first semiconductor structure 102 and a second semiconductor structure 104 formed thereon according to an exemplary embodiment. The substrate 100 may be formed from various semiconductor materials including, but not limited to, silicon (Si). The substrate 100 may be formed as a bulk substrate, as illustrated in FIG. 1, or as a semiconductor-on-insulator (SOI) substrate as understood by those ordinarily skilled in the art.

The first semiconductor structure 102 and the second semiconductor structure 104 are each formed on first and second portions of the 103/103', respectively, of the substrate 100. The first and second semiconductor structures 102/104 each include a gate dielectric 106, a dummy gate stack 108, and spacers 110. It is appreciated that the first and second semiconductor structures may form a three-dimensional semiconductor device such as a fin field effect transistor (finFET), for example, or a planar semiconductor device.

According to at least one embodiment, the gate dielectric 106 may comprise an oxide interface layer 112 and a high-dielectric (high-k) layer 114. The oxide interface layer 112 may be formed, for example, as silicon dioxide ($SiO_2$) or silicon oxynitride ($SiON_x$) from the substrate 100 as understood by those ordinarily skilled in the art. The high-k layer 114 may be deposited on the upper surface of the oxide interface layer 112 prior to forming the dummy gate stack 108 using, for example, an atomic layer deposition (ALD) process. In this regard, the high-k layer 114 is interposed between the oxide interface layer 112 and the dummy gate stack 108, and may extend to cover upper portions of one or more source/drain regions 113. The high-k layer 114 may be formed from various high-k materials including, but not limited to, hafnium oxide ($HfO_2$), hafnium silicate ($HfSiO_4$), zirconium silicate ($ZrSiO_4$), and zirconium dioxide ($ZrO_2$).

The dummy gate stacks 108 may be formed from polycrystalline silicon (PC) for example, and each may have varying gate lengths with respect to one another. For example, the first semiconductor structure 102 may have a first gate length $L_1$ (e.g., a narrow gate length) that ranges from, for example, approximately 10 nanometers (nm) to approximately 50 nm. The second semiconductor structure 104 may have a second gate length $L_2$ (e.g., a long gate length) that is greater than the first gate length. The second gate length $L_2$ may range, for example, from approximately 100 nanometers (nm) to approximately 1 micrometer ($\mu m$).

The spacers 110 may be formed on opposing sidewalls of the gate stacks 108. Various methods to form the spacers 110 may be used as understood by those ordinarily skilled in the art. The spacers 100 may be formed from various materials including, but not limited to, silicon nitride (SiN).

Figure 2:
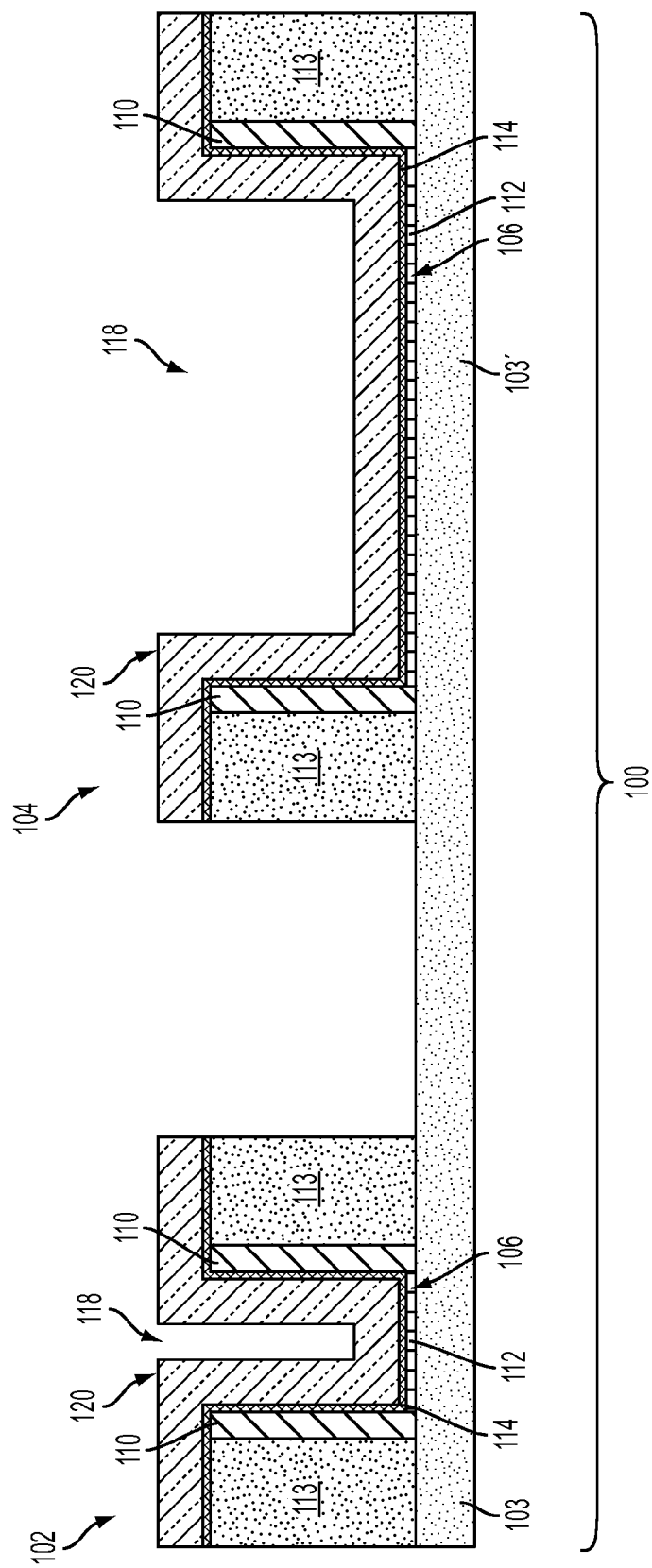
FIG. 2 illustrates the semiconductor structures of FIG. 1 after removing the dummy gate stacks to form respective gate voids and after depositing a thin conformal work function metal layer on the sidewalls and base of the gate voids.

Referring now to FIG. 2, the dummy gate stacks 108 are removed, thereby forming gate voids 118 in the first and second semiconductor structures 102/104. A thin conformal work function metal layer 120 is formed on the base and sidewalls of the gate voids 118. Various methods for depositing the work function metal layer 120 may be used including, but not limited to, an ALD process. The work function metal layer 120 is configured to tune the threshold voltage of the finalized semiconductor devices formed from the respective first and second semiconductor structures 102/104 as understood by those of ordinarily skilled in the art. According to an embodiment, the work function metal layer 120 may be formed from various materials including, but not limited to, titanium nitride (TiN) and tantalum nitride (TaN). Although the a gate void 118 is shown in the first semiconductor structure 102 following deposition of the work function metal layer 120, it is appreciated that work function metal 120 deposited on side walls of the gate void 118 of the first semiconductor structure 102 may pinch together. Accordingly, at least one embodiment may provide a first semiconductor structure 102 that excludes the gate void 118.

Figure 3:
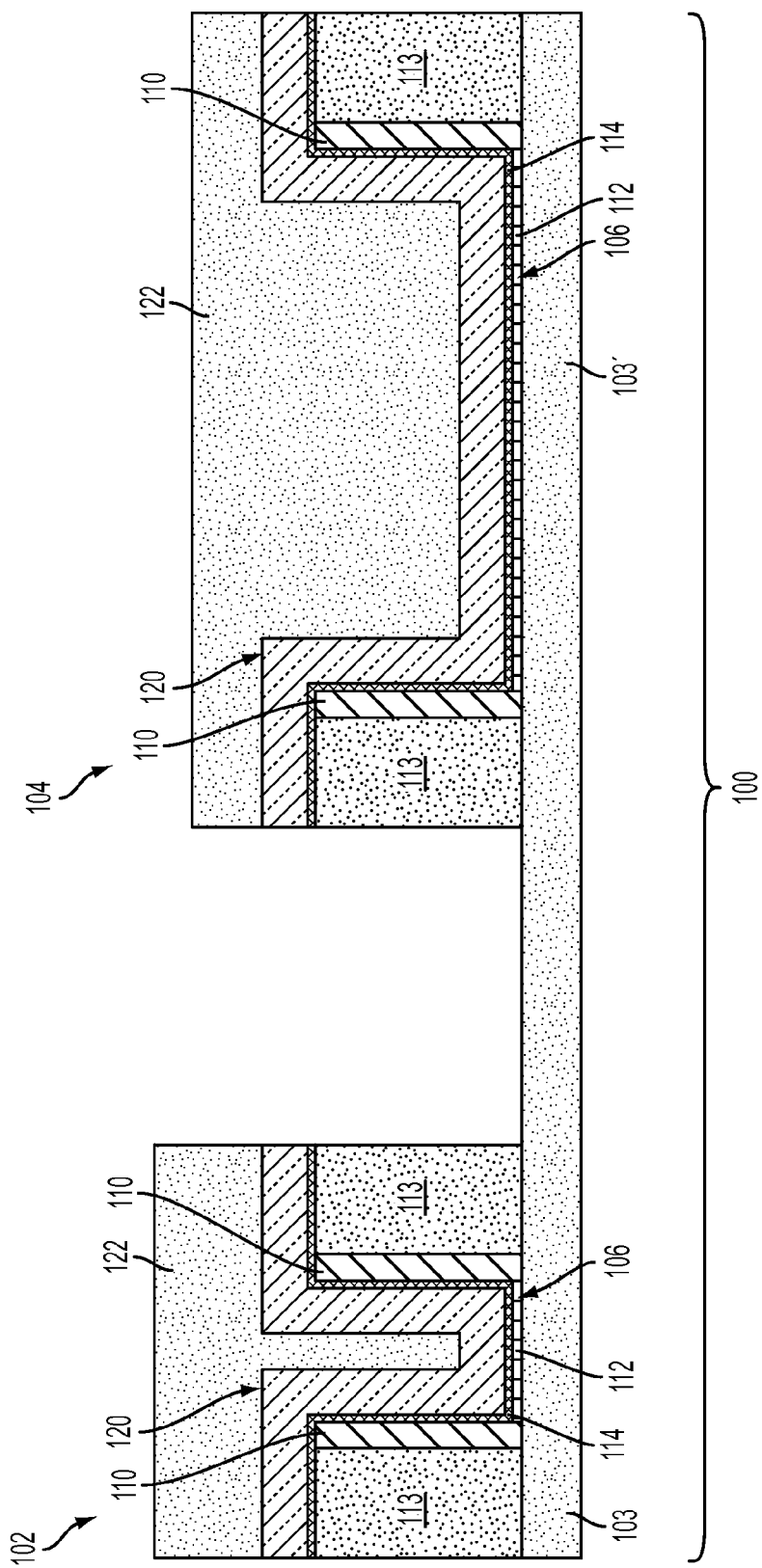
FIG. 3 illustrates the semiconductor structures of FIG. 2 following deposition of a silicon masking layer that fills the gate voids and covers the work function metal layer.

Turning to FIG. 3, a masking layer 122 is deposited in the gate voids 118 and covers the upper surface of the work function metal layer 120. Although the masking layer 122 will be described as a silicon (Si) masking layer 122 going forward, it is appreciated that the masking layer 122 may be formed from various other materials configured to provide a selective etching feature with respect to the work functional metal layer 120. As discussed above, at least one embodiment may provide a first semiconductor structure 102 that excludes the gate void 118. In this regard, a silicon masking layer 122 is deposited in only the gate void 118 of the second semiconductor structure 104.

Figure 4:
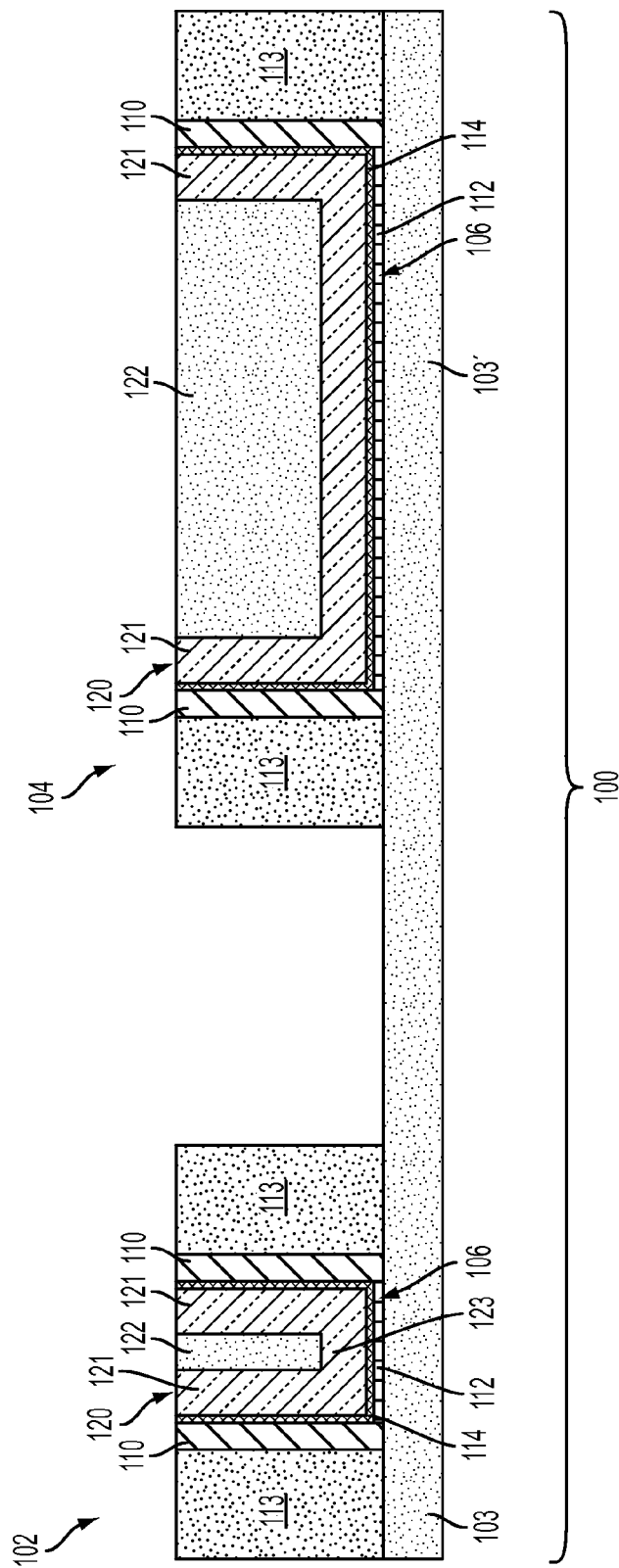
FIG. 4 illustrates the semiconductor structures of FIG. 3 following a polishing process that planarizes the work function metal layer and the silicon masking layer.

Referring to FIG. 4, the first and second semiconductor structures 102/104 are planarized according to, for example, a chemical mechanical polishing (CMP) process. The CMP process planarizes the work function metal layer 120 and the silicon masking layer 122, while stopping on the upper surface of the spacers 110. Accordingly, the high-k layer 114 and the work function metal layer 120 are removed from the upper surface of the source/drain regions 113 and the spacers 110.

Figure 5:
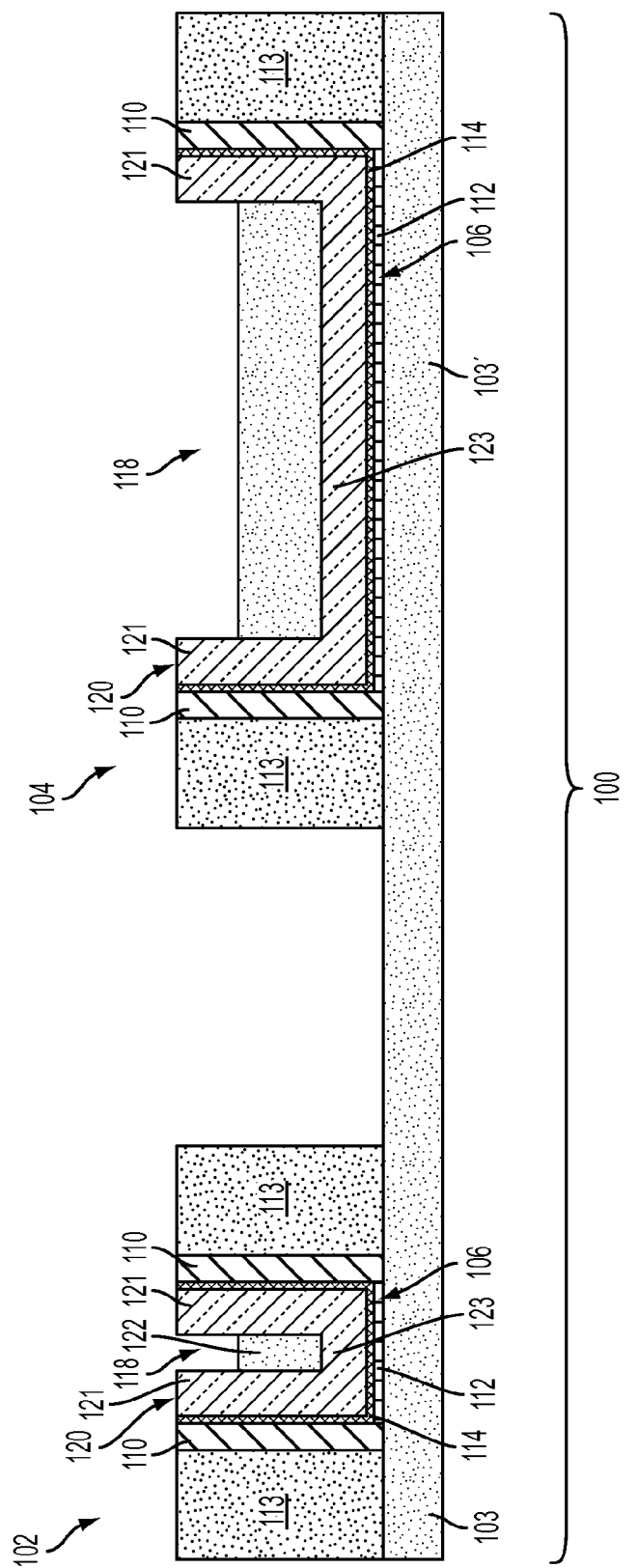
FIG. 5 illustrates the semiconductor structures of FIG. 4 following an etching process that is selective to the work function metal layer and partially recesses the silicon masking layer deposited in the gate void below the work function metal layer.

Turning now to FIG. 5, the silicon masking layer 122 deposited in the gate voids 118 is partially recessed. A dry or wet etching process, for example, that is selective to oxide material and metal (e.g., the work function metal layer 120) may be performed to recess the silicon masking layer 122. Various etching chemicals selective to the work function metal layer 120 may be used including, but not limited to, ammonium hydroxide ($NH_4OH$). Accordingly, the silicon masking layer 122 is recessed below the work function metal layer 120, while the upper surface of the work function metal layer 120 remains flush with respect to the upper surface of the spacers 110. In this regard, the work function metal layer 120 may be formed to include sidewall portions 121 that are separated from each other by a base portion 123. As illustrated further in FIG. 5, the silicon masking layer 122 of both the first and second semiconductor structures 102/104 may be simultaneously etched without using an additional masking layer. That is, unlike conventional fabrication methods that require an additional non-semiconductor masking layer (e.g., a polymer-based masking layer) that covers the second gate channel region (i.e., the longer gate channel), at least one exemplary embodiment provides a semiconductor masking layer 122 that allows for the exclusion of an additional non-semiconductor masking layer.

Figure 6:
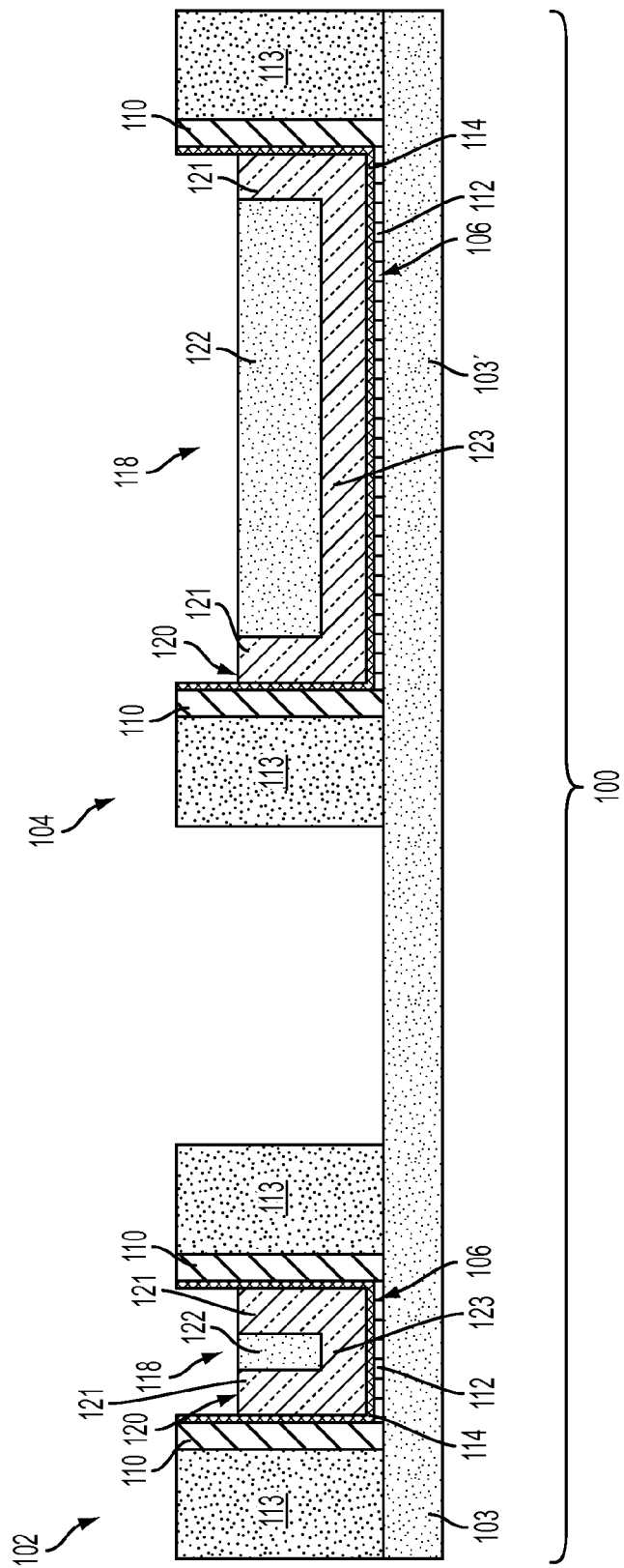
FIG. 6 illustrates the semiconductor structures of FIG. 5 following an etching process that partially recesses the work function metal layer.

Referring to FIG. 6, a second etching process is performed to partially recess the work function metal layer 120 of the first and second semiconductor structures 102/104. The second etching process may be, for example, a wet etching process that is selective to the oxide (e.g., the high-k dielectric layer 114) and the silicon masking layer 122. The second etching process may stop on upper portion of silicon masking layer 122 such that the work function metal layer 120 is recessed below the spacers 110 as further illustrated in FIG. 6. Accordingly, the upper portion of the work function metal layer 120 is flush with the upper surface of the silicon masking layer 122. In another exemplary embodiment, a reactive ion etching (RIE) process may be used that selectively etches the work function metal layer 120. Although the high-k layer 114 is illustrated as being maintained on sidewalls of the gate void 118, it is appreciated that the high-k layer 114 may also be etched from the sidewalls of the gate void 118.

Figure 7:
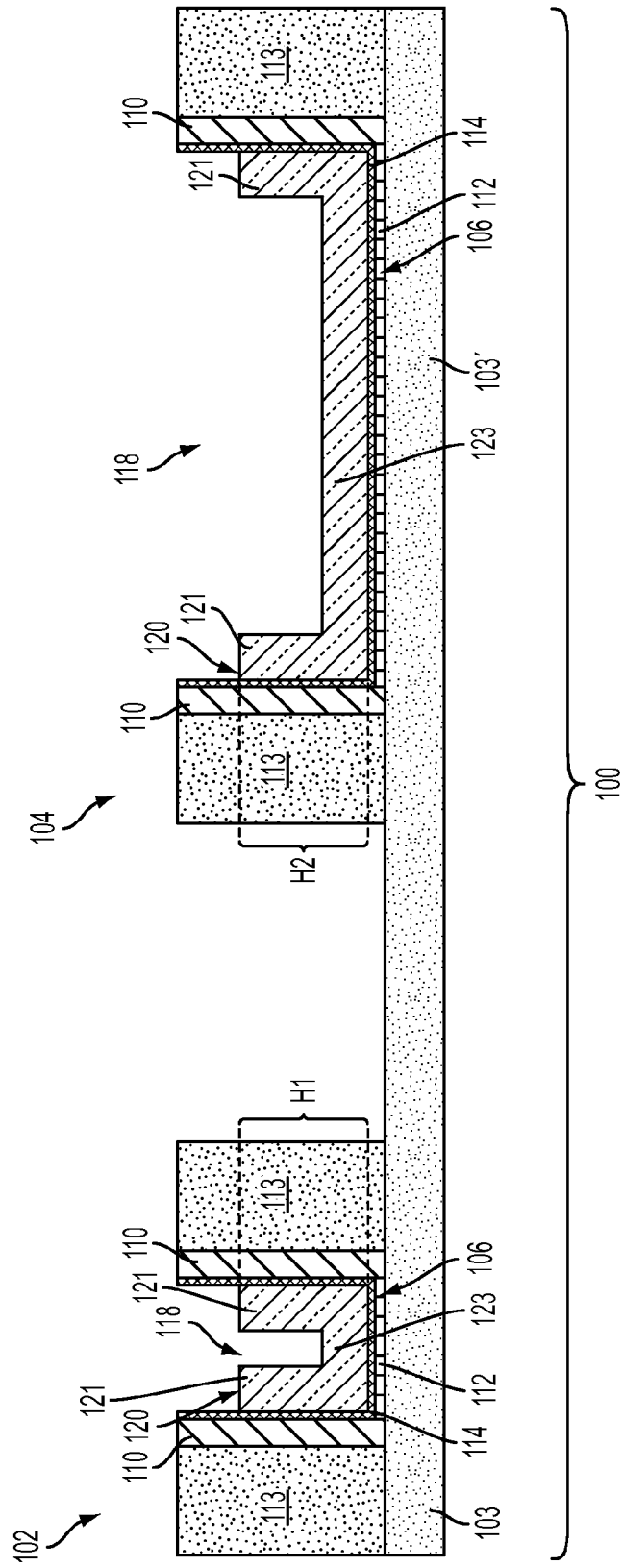
FIG. 7 illustrates the semiconductor structures of FIG. 6 following an etching process that is selective to the work function metal layer and removes the silicon masking layer to re-expose the work function metal layers.

Turning to FIG. 7, the silicon masking layer 122 is etched away from the work function metal layer 120. In this regard, residue of the masking layer 122 (e.g., silicon residue) may exist on the sidewalls of the work function metal layer 120. Various etching procedures may be used to remove the silicon masking layer 122 including, but not limited to, a dry etching procedure that utilizes a chemical selective that is selective to oxide material (e.g., the high-k layer 114) and metal (e.g., the work function metal layer 120). Various etching chemicals may be used including, but not limited to, ammonium hydroxide ($NH_4OH$). As illustrated further in FIG. 7, the silicon masking layer 122 of both the first and second semiconductor structures 102/104 may be simultaneously etched without using an additional masking layer. According to at least one exemplary embodiment, the silicon masking layer 122 may be simultaneously etched such that the distance between the upper surface of the work function metal layer 120 and the substrate 100 (e.g., the height $H_1$) corresponding to the first semiconductor structure 102 is equal to distance between the upper surface of the work function metal layer 120 and the substrate 100 (e.g., the height $H_2$) corresponding to the second semiconductor structure 104.

Figure 8:
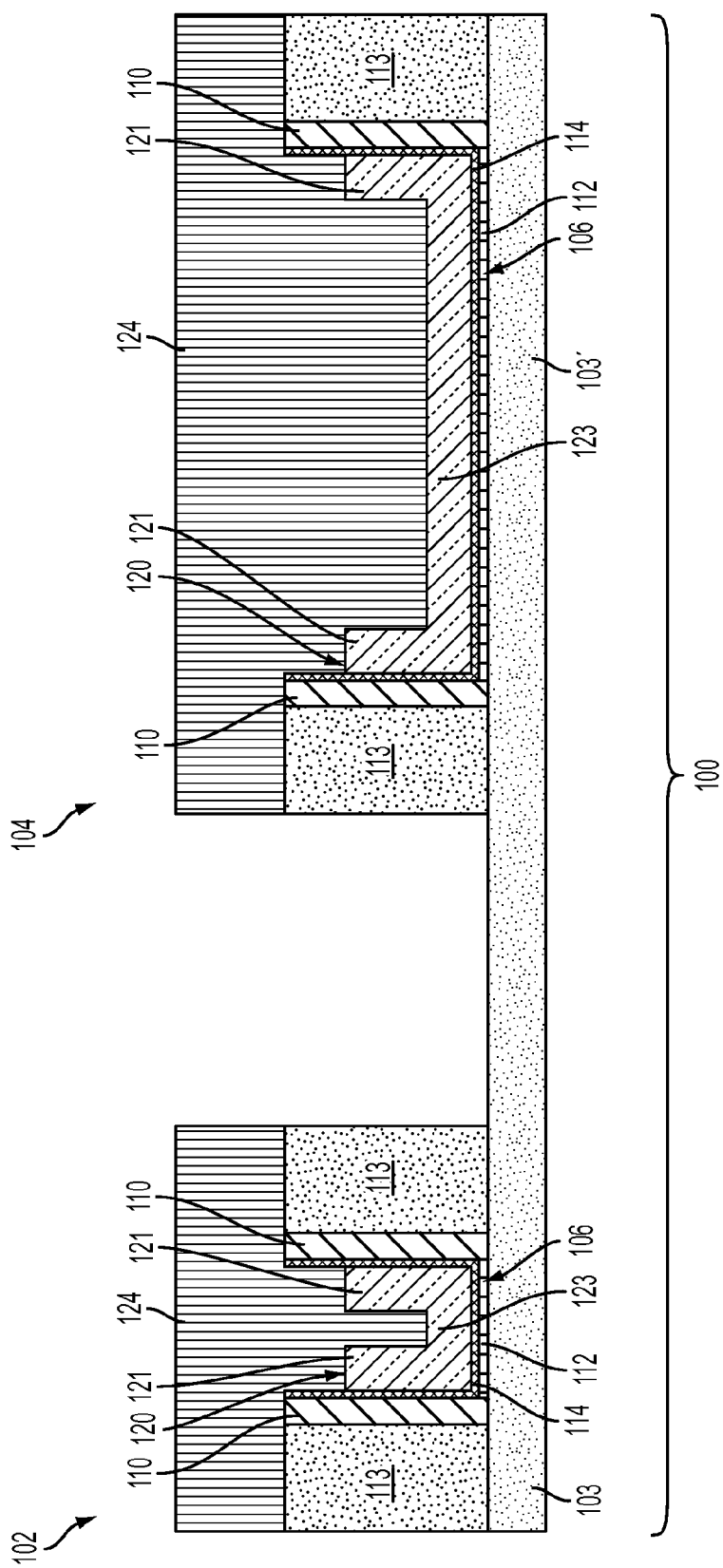
FIG. 8 illustrates the semiconductor structures of FIG. 7 following deposition of a low-resistive metal layer in the gate voids to cover the work function metal layer and an upper surface of the semiconductor structures.

Referring to FIG. 8, a metal layer fills the voids 118, and covers the work function metal layer 120 and the upper surfaces of the first and second semiconductor structures 102/104. Various methods for deposited the metal layer may be used including, but not limited to, a chemical vapor deposition (CVD) process and an ALD process. The metal layer 124 may be formed from various metals including, for example, low-resistive metals, to form a low-resistive metal layer 124. The low-resistive metals may include, but are not limited to, tungsten (W) and aluminum (Al).

Figure 9:
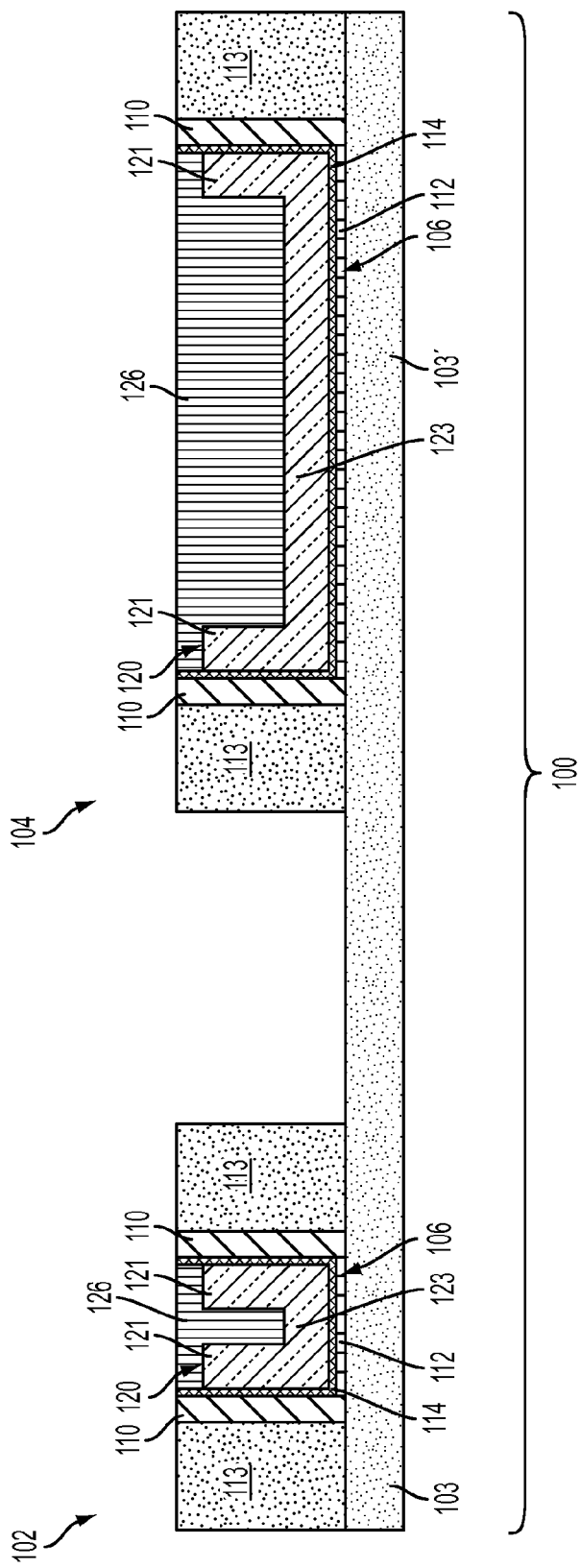
FIG. 9 illustrates the semiconductor structures of FIG. 8 following a polishing process that planarizes the work function metal layer and the low-resistive metal layer to form a low-resistive metal gate stack in each of the first and second semiconductor structures.

Turning now to FIG. 9, the work function metal layer 120 and the low-resistive metal layer 124 are planarized to form a low-resistive metal gate stack 126 in each of the first and second semiconductor structures 102/104. The upper surfaces of the work functional metal layer 120 and the low-resistive metal gate stack 126 may be formed flush with one another using, for example, a CMP process.

Figure 10:
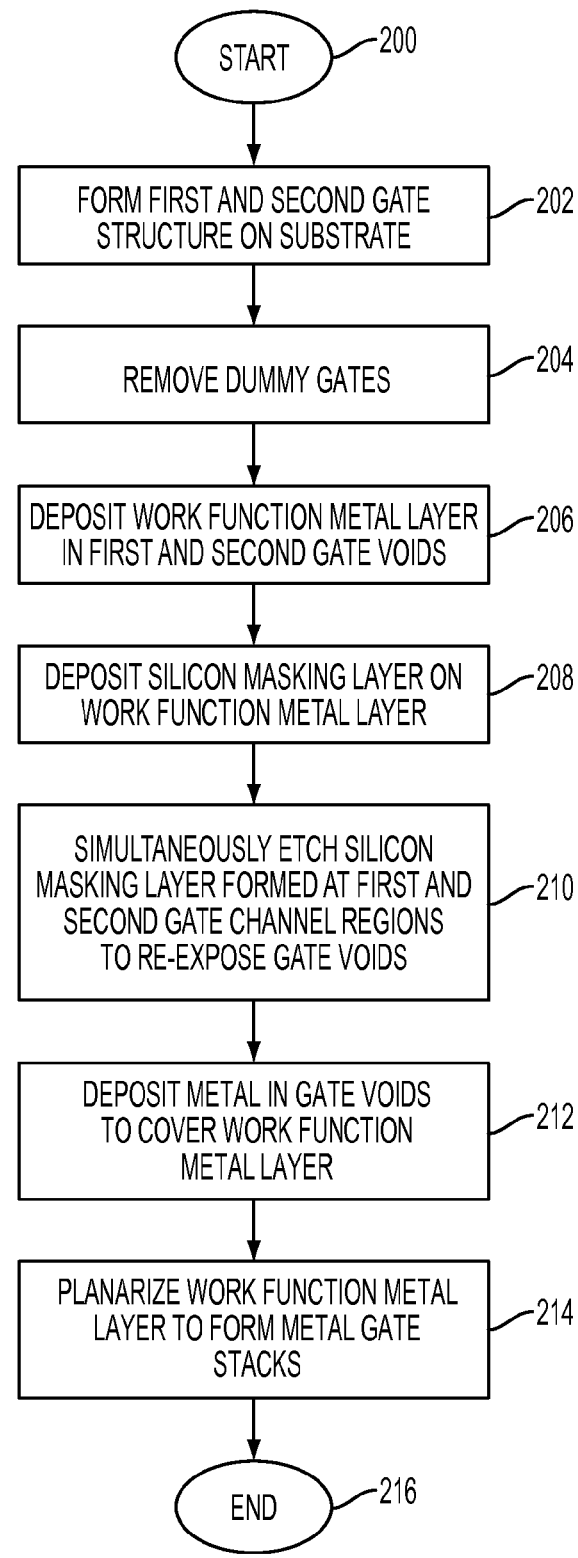
FIG. 10 is a flow diagram a flow diagram illustrating a method of forming a semiconductor device according to at least one exemplary embodiment.

Referring now to FIG. 10, a flow diagram illustrates a method of forming a semiconductor device according to at least one exemplary embodiment. The method begins at operation 200, and includes forming first and second semiconductor structures on a semiconductor substrate at operation 202. The first semiconductor structure includes a first gate channel region having a first gate length. The second semiconductor structure includes a second gate channel region having a second gate length that is greater than the first gate length. At operation 204, dummy gates corresponding to the first and second gate channel regions are removed. The dummy gates may be removed according to various replacement metal gate (RMG) procedures as understood by those ordinarily skilled in the art. At operation 206, a work function metal layer is deposited in each of a first gate void formed at the first gate channel region and a second gate void formed at the second gate channel region. The first and second gate voids may be formed, for example, by removing first and second dummy gate stacks from the respective first and second gate channel regions according to a replacement metal gate (RMG) process known to those ordinarily skilled in the art. At operation 208, a masking layer such as a silicon masking layer, for example, is deposited on the work function metal layer located at each of the first and second gate channel regions. At operation 210, the silicon masking layer located at the first and the silicon masking layer located at the second gate channel region are simultaneously etched to re-expose the first and second gate voids. At operation 210, a metal, such as a low-resistive metal for example, is deposited in the first and second gate voids. The metal is planarized to form metal gate stacks in the first and second gate channel regions at operation 214, and the method ends at operation 216.

As discussed in detail above, the silicon masking layer may effectively mitigate the etch loading effect on the long channel region of the second semiconductor structure when simultaneously etching the narrow channel region of the first semiconductor structure. Accordingly, a low-resistive metal gate stack 126 may be formed in a multichannel semiconductor device including variable gate lengths without using a separate masking layer to protect the long channel from etch loading effects. In this regard, overall costs to form low-resistive metal gate stacks in multichannel semiconductor device having variable gate lengths may be reduced.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A multigate semiconductor device, comprising:
first and second semiconductor structures formed on a semiconductor substrate, the first semiconductor structure including a first gate channel region having a first gate length and the second semiconductor structure including a second gate channel region having a second gate length that is greater than the first gate length;

a first work function metal layer formed in the first gate channel region and a second work function metal layer formed in the second gate channel region; the second work function metal layer including sidewall portions separated from one another by a base portion; and a first metal gate stack formed on the work function metal layer located at the first gate channel region and a second metal gate stack formed on the work function metal layer located at the second gate channel region, the second metal gate stack formed on upper portions of the sidewall portions, wherein a masking layer residue is interposed between the work function metal layers and the respective spacers formed on sidewalls of the second metal gate stack.

2. The multigate semiconductor device of claim 1, wherein a distance between an upper surface of the work function metal layer and the substrate located at the first gate channel region is equal to a distance between an upper surface of the work function metal layer and the substrate located at the second gate channel region.

3. The multigate semiconductor device of claim 2, wherein spacers are formed on sidewalls of the first and second metal gate stacks and a portion of the work function metal layer below is recessed below the spacers.

4. The multigate semiconductor device of claim 3, wherein the first work function metal layer includes sidewall portions formed against respective sidewalls of the spacers corresponding to the first semiconductor structure, the sidewall portions separated from one another by a base portion.

5. The multigate semiconductor device of claim 4, wherein the metal gate stack is formed on upper portions of the sidewall portions of the first work function metal layer.

6. The multigate semiconductor device of claim 5, wherein a portion of the metal gate stack is formed between upper portions of the respective spacers and upper portions of the sidewall portions of the work function metal layer.

7. The multigate semiconductor device of claim 6, wherein the first and second semiconductor structures each include a gate dielectric formed on the substrate, and wherein the work function metal layer is interposed between a respective metal gate stack and a respective gate dielectric.

8. The multigate semiconductor device of claim 7, wherein the metal material is a low-resistive metal selected from a group comprising tungsten (W) and aluminum (Al).

9. The multigate semiconductor device of claim 8, wherein the work metal function layer is formed from a material selected from a group comprising titanium nitride (TiN) and tantalum nitride (TaN).

10. The multigate semiconductor device of claim 9, wherein the residue is silicon (Si) residue.

* * * * *